(12) United States Patent
Meister et al.

(10) Patent No.: US 8,471,652 B2
(45) Date of Patent: Jun. 25, 2013

(54) COMPONENT THAT OPERATES USING ACOUSTIC WAVES AND METHOD FOR PRODUCING SAID COMPONENT

(75) Inventors: Veit Meister, Kagel (DE); Werner Ruile, Munich (DE)

(73) Assignee: EPCOS AG, Munich (DE)

( * ) Notice: Subject to any disclaimer, the term of this patent is extended or adjusted under 35 U.S.C. 154(b) by 870 days.

(21) Appl. No.: 11/576,981

(22) PCT Filed: Sep. 26, 2005

(86) PCT No.: PCT/EP2005/010387
§ 371 (c)(1),
(2), (4) Date: Jan. 9, 2008

(87) PCT Pub. No.: WO2006/040001
PCT Pub. Date: Apr. 20, 2006

(65) Prior Publication Data
US 2008/0094150 A1    Apr. 24, 2008

(30) Foreign Application Priority Data

Oct. 11, 2004 (DE) .......................... 10 2004 049 498

(51) Int. Cl.
*H03H 9/205* (2006.01)
*H01L 41/083* (2006.01)
*H01L 41/22* (2006.01)

(52) U.S. Cl.
USPC .......................... 333/189; 29/25.35; 310/364

(58) Field of Classification Search
USPC ......... 333/189, 191, 186–187, 190, 192–196, 333/150–155; 310/320, 321, 363–366; 29/592.1, 25.35–25.42
See application file for complete search history.

(56) References Cited

U.S. PATENT DOCUMENTS

| | | | | |
|---|---|---|---|---|
| 3,836,877 | A | * | 9/1974 | Guntersdorfer et al. ....... 333/187 |
| 3,931,598 | A | * | 1/1976 | Bongianni ..................... 333/150 |
| 4,329,666 | A | * | 5/1982 | Arvanitis ..................... 333/191 |
| 4,598,261 | A | * | 7/1986 | Ballato ....................... 333/195 |
| 5,101,377 | A | | 3/1992 | Yamada |
| 5,163,435 | A | | 11/1992 | Soldner et al. |

(Continued)

FOREIGN PATENT DOCUMENTS

| | | |
|---|---|---|
| DE | 103 19 554 | 11/2004 |
| EP | 0 362 478 | 12/1999 |

(Continued)

OTHER PUBLICATIONS

Written Opinion with English translation for PCT/EP2005/010387, of Mar. 13, 2006.

(Continued)

*Primary Examiner* — Dean O Takaoka
*Assistant Examiner* — Alan Wong
(74) *Attorney, Agent, or Firm* — Fish & Richardson P.C.

(57) ABSTRACT

An acoustic wave component includes a layer system having a piezoelectric layer and a first metal layer arranged on the piezoelectric layer, a first resonator having a first electrode in the first metal layer, where the first metal layer includes electrode structures periodically arranged in a direction of propagation of a wave through the acoustic wave component, and a second resonator coupled to the first resonator and electrically isolated from the first resonator. The layer system includes a waveguide for guiding a guided bulk acoustic wave in a lateral direction of the acoustic wave component.

11 Claims, 12 Drawing Sheets

U.S. PATENT DOCUMENTS

| | | | |
|---|---|---|---|
| 5,294,898 | A | 3/1994 | Dworsky et al. |
| 5,386,085 | A | 1/1995 | Miehls et al. |
| 5,910,756 | A | 6/1999 | Ella |
| 6,121,856 | A * | 9/2000 | Apostolos .................... 333/141 |
| 6,720,844 | B1 | 4/2004 | Lakin |
| 6,734,600 | B2 | 5/2004 | Aigner et al. |
| 7,057,478 | B2 | 6/2006 | Korden et al. |
| 7,098,758 | B2 * | 8/2006 | Wang et al. .................. 333/189 |
| 7,262,676 | B2 * | 8/2007 | Ruile et al. ................... 333/193 |
| 2002/0043888 | A1 * | 4/2002 | Aigner et al. ............ 310/313 B |
| 2003/0128081 | A1 | 7/2003 | Ella et al. |
| 2005/0012570 | A1 | 1/2005 | Korden |
| 2005/0057323 | A1 | 3/2005 | Kando |
| 2008/0297277 | A1 | 12/2008 | Meister et al. |
| 2010/0039000 | A1 * | 2/2010 | Milson et al. ................ 310/366 |

FOREIGN PATENT DOCUMENTS

| | | |
|---|---|---|
| EP | 0963040 | 12/1999 |
| JP | 54-069363 | 6/1979 |
| JP | 58-173912 | 10/1983 |
| JP | 61-127218 | 6/1986 |
| JP | 01-308070 | 4/1990 |
| JP | 02-109411 | 4/1990 |
| JP | 04-018806 | 1/1992 |
| JP | 11-017489 | 1/1999 |
| JP | 11-284478 | 10/1999 |
| JP | 11-308070 | 11/1999 |
| JP | 2983252 B2 * | 11/1999 |
| JP | 2000-069594 | 3/2000 |
| JP | 2002-368576 | 12/2002 |
| JP | 2002-541704 | 12/2002 |
| JP | 2004-159262 | 6/2004 |
| WO | WO00/60737 | 10/2000 |
| WO | WO01/99276 | 12/2001 |
| WO | WO2006/039996 | 4/2006 |
| WO | WO2006/040001 | 4/2006 |

OTHER PUBLICATIONS

English translation of Search Report for PCT/EP2005/010387, of Mar. 13, 2006.

G.G. Fattinger et al "Coupled Bulk Acoustic Wave Resonator Filters: Key Technology for Single-to-Balanced RF Filters" IEEE 2004 MTT-S Digest; pp. 927-929.

L. Elbrecht et al Intergration of Bulk Acoustic Wave Filters: Concepts and Trends: IEEE 2004 MTT-S Digest; pp. 395-398.

M. Franosch et al "Wafer-Level-Package for Bulk Acoustic Wave (BAW) Filters" IEEE 2004 MTT-S Digest; pp. 493-496.

English Translation of Intl'l. Preliminary Report on Patentability & Written Opinion in Application No. PCT/EP2005/010336, dated Apr. 24, 2007.

English Translation of Int'l. Preliminary Report on Patentability & Written Opinion in Application No. PCT/EP2005/010387 dated Apr. 24, 2007.

International Search Report in Application No. PCT/EP2005/010336, dated Jan. 16, 2006.

International Search Report in Application No. PCT/EP2005/010387, dated Mar. 10, 2006.

Lakin, K., "Thin Film Resonator Technology", Proc. of the 2003 IEEE Int'l. Frequency Control Symp. & PDA Exhibition jointly with the 17th European Frequency and Time Forum, XP010688892, pp. 765-778 (May 2003).

Action and Response History in U.S. Appl. No. 11/576,985.

English Translation of Notification of Reasons for Refusal in Japanese Patent Application No. 2007-535054, dated Apr. 21, 2011.

Machine Translation of Japanese Patent Pub. No. 11-017489 (Pub. Date Jan. 1999).

Machine Translation of Japanese Patent Pub. No. 11-284478 (Pub. Date Oct. 1999).

Machine Translation of Japanese Patent Pub. No. 2000-069594 (Pub. Date Mar. 2000).

English Translation of Notification of Reasons for Refusal in Japanese Patent Application No. 2007-535054, dated Mar. 14, 2012.

Machine Translation of Japanese Publication No. 2002-368576, (Pub. Date Dec. 2002).

Machine Translation of Japanese Publication No. 61-127218, (Pub. Date Jun. 1986).

* cited by examiner

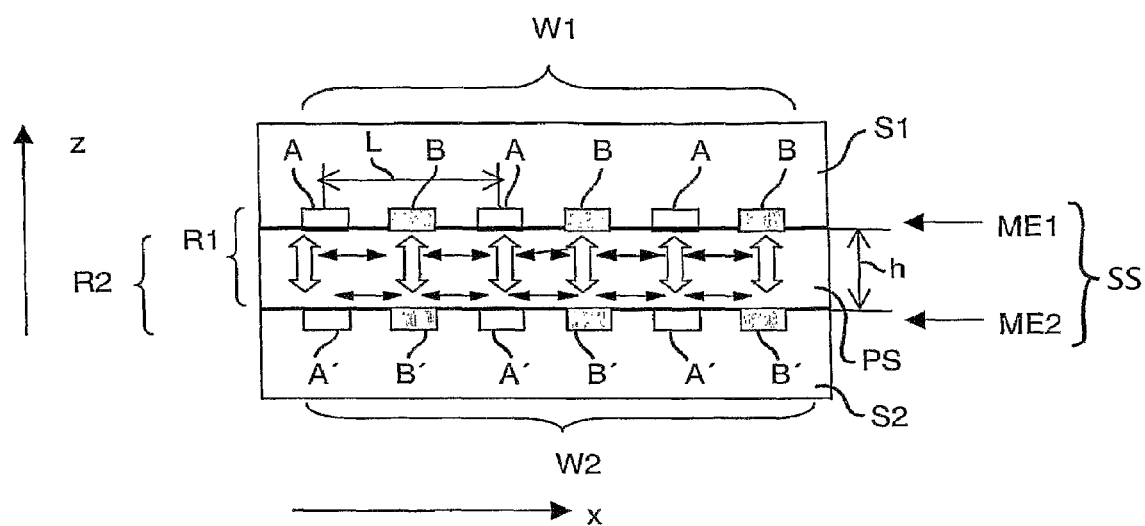
Fig. 2A
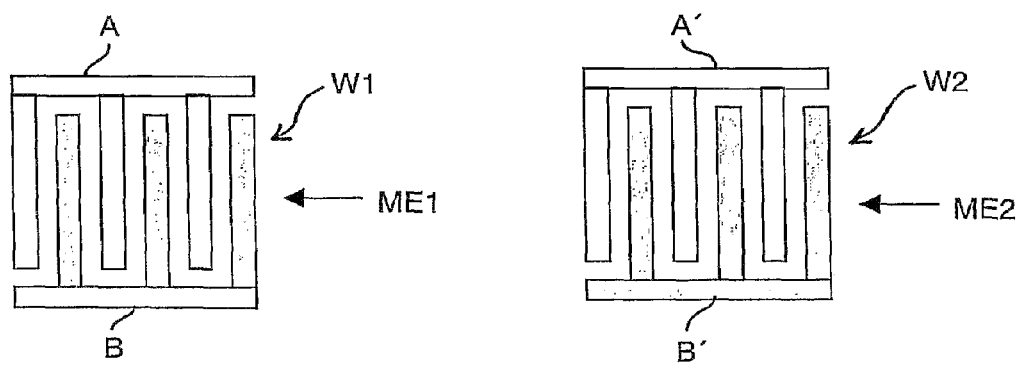
Fig. 2B
Fig. 2C

COMPONENT THAT OPERATES USING ACOUSTIC WAVES AND METHOD FOR PRODUCING SAID COMPONENT

TECHNICAL FIELD

This patent application describes an acoustic wave component and a method for the manufacture thereof.

BACKGROUND

Bulk Acoustic Wave (BAW) resonators arranged one beside the other, connected electrically by a shared electrode, and acoustically coupled to one another are known from WO 01/99276 A1.

SUMMARY

Described herein is an acoustic wave component that can be operated in an unbalanced/balanced mode or a balanced/balanced mode. Also described herein is a method for manufacturing such a component Described herein is a component that operates with guided bulk acoustic waves (GBAW) that comprises two resonators acoustically coupled to one another. The electrodes of the resonators are electrically isolated from one another. In an embodiment, each resonator comprises an interdigital transducer with periodically arranged electrode structures. An interdigital transducer is referred to below simply as a transducer.

As in known SAW components, the electrode structures can be provided with weighting, variable finger center-to-center distance, focusing properties, bent fingers, fingers of variable length as well as a differing aperture over the length of the acoustic track (in the transversal direction, the overlap length of two adjacent differently charged electrode structures).

The bulk acoustic wave is guided in a lateral plane in an acoustic waveguide that is formed by a layer system. The layer system comprises a piezoelectric layer and a structured first metal layer thereon, in which the electrode structures of the first electrode of the first resonator are formed. In one embodiment, the second electrode of the first resonator can be arranged in the same metallization plane as the first electrode, and can form the first transducer. In this case, the electrode structures of the two electrodes lie one next to the other, with the electrical excitation taking place in the lateral direction.

In an additional embodiment, the second electrode of the first resonator can be arranged, for instance, in a metallization plane arranged underneath the piezoelectric layer. The electrode structures of the two electrodes in this case lie one above the other, with the electrical excitation taking place in the vertical direction.

The electrical excitation between the electrode structures (side by side or one above the other) of the same resonator is referred to as the primary excitation. With electrodes of the same resonator in different metallization planes, it is possible for the electrodes of different resonators in the same plane to interpenetrate one another. The electrical excitation that takes place between the electrode structures of different resonators situated one next to the other is referred to as secondary excitation.

In one embodiment, the layer system further comprises a dielectric layer arranged on the metal layer, e.g., having a planar surface on its side facing away from the metal layer. The dielectric layer can be excluded in one embodiment.

The resonator can be formed, for example by a transducer and the layers of the layer system arranged below or above it. A resonator can also be formed by two reflectors and a transducer arranged between them. An acoustic resonator arrangement with coupled resonators can be formed by an arbitrary acoustic track with a layer structure suitable for guiding GBAW. It is possible, for instance, to arrange the resonators acoustically coupled to one another in an acoustic track bounded by two reflectors.

The thickness h of the piezoelectric layer can be markedly less than $\lambda$, where $\lambda$ is the wavelength of the acoustic wave at the operating frequency of the component. The thickness of the piezoelectric can lie, for example, between $\lambda/2$ and $2\lambda$. In an embodiment, h can be essentially equal to $\lambda$ or $\lambda/2$.

The layer system may be arranged between two substrates.

A transducer has two comb-like electrodes that interpenetrate one another. The electrode structures are periodically arranged metal strips that are connected to a collective track. The electrical excitation in a transducer takes place between two electrode structures with different potentials arranged one next to the other. An acoustic wave that propagates in the lateral, or in the longitudinal, direction in the bulk of the piezoelectric is excited in this case.

The acoustically coupled and galvanically separated resonators can be used, in particular, for the galvanic separation of electrical ports of a component with at least one symmetric port. The periodic arrangement of the electrode structure in the lateral plane specifies the wavelength $\lambda$ of the GBAW. The centers of the electrode structure connected to the same potential may be separated from one another by one wavelength.

The excitation of the wave in the lateral direction takes place at excitation centers between two electrode structures arranged on one piezoelectric layer and connected to different electric potentials. In the case of electrode structures arranged one above the other and connected to one another via a piezoelectric layer, the excitation takes place in the vertical direction. The excitation in a given direction refers to the arrangement of excitation centers, or of two oppositely charged electrode structures along this direction.

A resonator arrangement with primary excitation in the lateral or longitudinal direction and secondary excitation in the vertical direction is also possible. Likewise possible is a resonator arrangement with primary excitation in the vertical direction and secondary excitation in the lateral or longitudinal direction.

With lateral excitation, the lateral distance between the centers of the equally charged electrode structures formed in the same metal layer may be essentially $\lambda$. The distance between the centers of the oppositely charged electrode structures formed in the same metal layer may be essentially $\lambda/2$. With vertical excitation, the vertical minimum distance between the oppositely charged electrode structures, corresponding to the thickness of the piezoelectric layer, is essentially $\lambda/2$.

It is advantageous if the direction in which the acoustic coupling between resonators takes place is displaced by 90° relative to the direction of excitation; e.g., the excitation takes place in the longitudinal direction and the acoustic coupling in the transversal or vertical direction. Alternatively, excitation in the vertical direction and acoustic coupling in the transversal and/or longitudinal direction is possible. The acoustic coupling in the prescribed direction is done via an acoustic mode that propagates in this direction.

It is also possible for the excitation and the acoustic coupling to take place in the same direction.

The transducer arrangement of a component operating with GBAW can be selected as for conventionally known Double Mode Surface Acoustic Wave (DMS) filters, wherein for a component as described herein, in contrast to known arrangements, it is not the transducers, but rather the resonators containing these transducers that are acoustically coupled to one another in the longitudinal direction (via GBAW instead of SAW). The two resonators acoustically coupled to one another here are arranged one beside the other in the same acoustic track. Also possible are two-track arrangements operating with GBAW, in which the first metal layer comprises a structure corresponding to a two-track DMS arrangement (e.g., with three transducers per acoustic track). The acoustic tracks here are connected to one another via the resonators containing the coupling transducers.

With electrical excitation and acoustic coupling in the lateral direction, it is possible to transfer arbitrary known transducer and resonator arrangements operating with SAW, for instance, transversal mode resonators (TMR), to the component described herein.

Excitation in both the longitudinal and the vertical direction and acoustic coupling in the transversal direction are also possible (see FIG. 5A).

It is also possible to form two comb-like electrodes of a resonator that are connected to opposite electric potentials in different lateral planes, e.g., a first electrode in the first metal layer and a second electrode in the second metal layer, the structures of the two electrodes being situated opposite one another. In this case, the guided bulk wave is excited in the vertical direction and propagates in the lateral direction.

It is also possible for the two electrodes to be offset relative to one another by a certain amount in the lateral direction and/or rotated relative to one another by a certain angle in order, for instance, to achieve a certain form of excitation.

In one embodiment, there can be a vertical electrical excitation of an acoustic mode between mutually opposing electrode structures situated one above one another. The electrical excitation of a wave mode in the vertical direction can take place alongside the excitation in the lateral direction. The vertical excitation takes place, for example, between a "hot" electrode structure of the first transducer and an opposing "cold" electrode structure of the second transducer, and conversely. In this case, two modes of the guided bulk wave are excited simultaneously. The frequency of the vertically excited mode can be shifted relative to the laterally excited mode. It is advantageous if the primarily excited wave corresponds to the operating frequency of the resonator, with the frequency of the secondarily excited wave differing from the operating frequency by less than 20%. It is also possible, however, for the frequencies of the two modes to coincide.

In one embodiment, the layer system comprises a second metal layer, which is arranged underneath the piezoelectric layer. Structures of the second transducer, which lie opposite from the structures of the first transducer, can be arranged in the second metal layer. The first resonator is formed by the structures of the first transducer and the piezoelectric layer arranged above it. The second resonator is formed by the structures of the second transducer and the piezoelectric layer arranged above it. The piezoelectric layer serves in this case as the coupling system for acoustic coupling of the two resonators in the vertical direction.

The transducers of the two resonators acoustically coupled to one another can be arranged in the same lateral plane which corresponds, for instance, to the first metal layer. The transducers can be arranged one alongside the other in the longitudinal direction, i.e., the direction of propagation of the acoustic wave. The corresponding resonators are acoustically coupled to one another in this direction via the piezoelectric layer. The direction of the electrical excitation coincides with the direction of the acoustic coupling. The transducers can also be arranged one alongside the other in the transversal direction. The resonators corresponding to the transducers are acoustically coupled to one another in this direction via the piezoelectric layer.

Alternatively, a conductive surface (e.g., ground surface) lying opposite the structures of the first transducer can be formed in the second metal layer. The conductive surface can be floating in one embodiment. In an embodiment, the conductive surface is connected to a reference potential.

In one embodiment, the conductive surface lies opposite the first and the second transducer. The transducers are arranged in the same lateral plane. In this case, the combination of the piezoelectric and the conductive surface forms a coupling system that couples the two resonators to one another. The continuous conductive surface is advantageous for a component to be operated in balanced/balanced mode. The first transducer is connected to a first symmetric port and the other is connected to a second symmetric port.

In an additional embodiment, the two transducers are arranged in the same lateral plane. The first transducer is arranged above the first conductive surface, and the second transducer above a second conductive plane, electrically isolated from the first conductive surface. The transducers may be arranged one alongside the other in the transversal direction. In this case, the resonators associated with the transducers are acoustically coupled to one another in the transversal direction and are electrically decoupled from one another. The conductive surfaces may each be connected to a reference potential of their own. The conductive surfaces electrically isolated from one another are advantageous for a component to be operated in unbalanced/balanced mode where, for instance, the first transducer is connected to an asymmetric first port, and the second transducer to a symmetric second port.

The primary electrical excitation is done in the lateral direction between the electrode structures of the same transducer. The secondary electrical excitation can take place in the vertical direction between the electrode structures of one of the transducers and the conductive surface (e.g., a grounded surface) lying below it.

The piezoelectric layer can comprise two sub-layers. They can be separated from one another by a third metal layer. The sub-layers can have different orientation of the piezoelectric axis. A point-symmetric, mirror-symmetric or antimirror-symmetric orientation of the piezoelectric axes relative to the boundary surface of the sub-layers is advantageous. Particularly advantageous is the antiparallel orientation of the piezoelectric axes (e.g., with an orthogonal orientation of the respective axis relative to the boundary surface of the sub-layers). The orientation of the piezoelectric axes in the two sub-layers relative to this boundary surface can also be identical or antiparallel, however. The first transducer is arranged here in the first metal layer, and the second transducer in the second one. The electrode structures of the two transducers may lie one above the other. A continuous ground surface arranged between the first and the second transducer may be formed in the third metal layer.

Likewise possible is a resonator arrangement in which the two resonators each comprises a first electrode formed in the first metal layer, and a second electrode formed in the second layer. The electrode structures of the first and second electrodes here lie one above the other. The first (and second) electrodes of the first and second resonator are respectively formed in the same metal layer and arranged alternately in the longitudinal direction, so that the comb-like first (and second, respectively) electrodes of the two resonators interpenetrate one another.

The primary electrical excitation takes place in the vertical direction between electrode structures of the same resonator. The secondary electrical excitation can take place in the lateral direction between the electrode structures of different resonators arranged one alongside the other in the same metal plane.

The distance between the centers of the electrode structures of the corresponding resonator electrode formed in the same metal layer may be one wavelength. The distance between the centers of the electrode structures of the different resonators formed in the same metal layer is adapted to the phase angle of the wave to be excited laterally.

In one embodiment, the resonators with the vertical primary excitation are arranged one alongside the other in the longitudinal direction. The acoustic coupling between the resonators in this case takes place in the longitudinal direction.

In an additional embodiment, the resonators with the primary excitation in the vertical direction are arranged one alongside the other in the transversal direction. The acoustic coupling between the resonators in this case takes place in the transversal direction.

The two resonators can each be connected symmetrically, or arranged in mutually different cross branches connected between two symmetric signal paths. It is also possible, however, for one of the resonators to be asymmetrically connected. One electrode of the asymmetrically connected resonator is then connected to a reference potential.

Also described herein is a method for manufacturing a component operating with guided acoustic waves. The method comprises the following steps:

A) a layer structure of a first metal layer, a piezoelectric layer and structured second metal layer is produced on a sacrificial substrate;
B) the layer structure is tightly joined to a substrate;
C) the sacrificial substrate is removed;
D) the first metal layer is structured;
E) the layer structure is tightly joined on the side of the first metal layer to an additional substrate.

Any desired electrically insulating or semi-insulating materials are suitable as substrates. The substrates (e.g., silicon oxide, silicon nitride, polymers) may be applied to the surface of the layer structure provided therefor in a thick film method, each as a thick layer. The free surface of the substrates can be planarized after hardening of the substrate material.

The deposition of a layer stack instead of only one substrate is also possible. The deposition can be done by, for example, chemical vapor deposition or additional layer deposition methods.

The substrates can be tightly connected to the rest of the layer structure by wafer bonding. In this case, it is advantageous to apply a dielectric planarization layer, silicon oxide for instance, to the first metal layer before step B) and to the second metal layer before step E). It is also possible to use a semiconductor material such as Si as a substrate.

The planarization layer is initially formed as a dielectric layer, which is planarized, for instance, by chemical mechanical polishing.

In one embodiment, a multilayer system comprising several piezoelectric layers is produced, instead of only one piezoelectric layer. First, steps A)-C) are performed. An additional layer structure, comprising an additional piezoelectric layer and a structured third metal layer, is applied to the exposed surface of the first metal layer. The additional layer is structured is connected on the side of the third metal layer to an additional substrate.

Embodiments are described herein with reference to associated figures. The figures show various embodiments on the basis of schematic representations not drawn to scale. Identical or identically functioning parts are labeled with the same reference symbols.

DESCRIPTION OF THE DRAWINGS

FIG. 2A, in cross section, the layer structures of a component operating with GBAW, with a primary electrical excitation in two lateral planes, a secondary excitation and an acoustic coupling in the vertical direction;

FIG. 2B, the plan view onto the first transducer according to FIG. 2A;

FIG. 2C, the plan view onto the second transducer according to FIG. 2A;

DETAILED DESCRIPTION

Figure 1A:
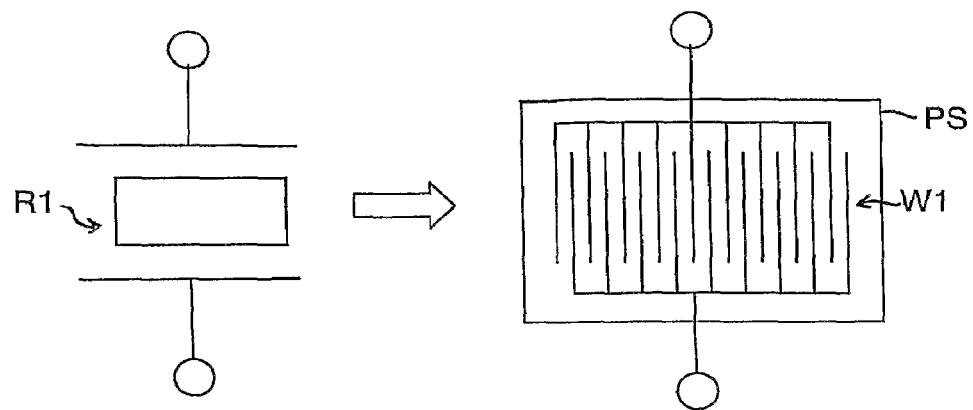
FIG. 1A, a resonator comprising a transducer.

A resonator R1 operating with GBAW that comprises a transducer W1 and a piezoelectric layer PS lying underneath it is shown schematically in FIG. 1A. Transducer W1, also shown in FIG. 2B, is formed in a first metal layer ME1 represented in FIG. 2A. Metal layer ME1 and piezoelectric layer PS are associated with a layer system SS, shown in FIG. 9E, that serves as waveguide and suitable for guiding GBAW.

Figure 1B:
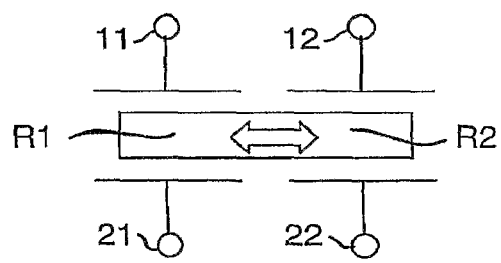
FIG. 1B, acoustically coupled resonators arranged in cross branches (equivalent circuit diagram)
Figure 1C:
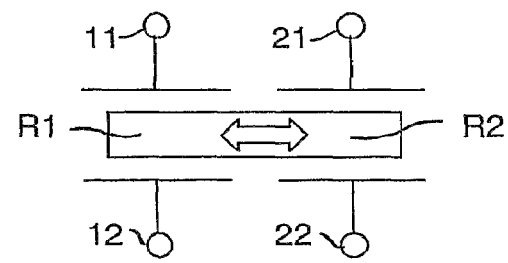
FIG. 1C, acoustically coupled resonators arranged in different signal paths (equivalent circuit diagram)

The component according to FIGS. 1B, 1C comprises two resonators R1, R2 acoustically coupled to one another.

The GBAW is guided in a lateral direction—referred to below as the longitudinal direction—in a substrate on which the transducer structures are arranged. In the case of transducers arranged one alongside the other, the acoustic coupling between two resonators can take place in the lateral plane, and in the case of transducers arranged one above the other, in the vertical direction. Depending on the transducer arrangement, the electrical excitation can take place in the lateral plane or in the vertical direction.

The equivalent surface diagram of a component comprising two electrical ports is shown in FIGS. 1B, 1C. The first port (e.g., input port) has a first terminal 11 and a second terminal 12. The second port (output port) has a first terminal 21 and a second terminal 22. In one embodiment, a first port is formed symmetrically and a second port asymmetrically. In another embodiment, both ports are connected symmetrically. Asymmetric connection of the two ports is also possible. A first signal path is arranged between terminals 11, 21 of the two ports. A second signal path is arranged between terminals 12, 22 of the two ports.

First resonator R1 is arranged in FIG. 1C between first and second terminals 11, 12 of the first port. Second resonator R2 is correspondingly connected to second port 21, 22. Resonators R1, R2 are thus arranged in cross branches that connect the two signal paths. In FIG. 1B the acoustically coupled resonators are arranged in different signal paths.

In a schematic cross section, FIG. 2A shows a section of component operating with GBAW with a piezoelectric layer PS arranged between two structured metal layers ME1 and ME2. Together, piezoelectric layer PS and metal layers ME1 and ME2 form a layer system SS that is arranged between two substrates S1 and S2.

A first transducer W1 with two oppositely charged electrodes A and B is formed in the first metal layers ME1. A second transducer W2 with two oppositely charged electrodes A' and B' is formed in second metal layers ME2. The plan view onto first transducer W1 from above is shown in FIG. 2B and that onto second transducer W2 is FIG. 2C. The electrical excitation in the first transducer is done between the structures of electrodes A and B arranged side by side. The electrical excitation in the second transducer is done between the structures of electrodes A' and B' arranged side by side. In this case the primary excitation, indicated by horizontal simple arrows, takes place along the longitudinal direction x in two lateral planes ME1, ME2.

A secondary excitation in the vertical direction z can take place between the opposing structures of electrodes A and A' (and B and B' respectively).

First resonator R1 is formed by first transducer W1 and piezoelectric layer PS lying below it. Second resonator R2 is formed by second transducer W2 and piezoelectric layer PS lying above it.

The thickness of the piezoelectric layer or, in other terms, the distance between metal layers ME1, ME2 rules the wave length of the bulk wave to be excited.

The distance L between the centers of the equally charged electrode strips is essentially equal to one wavelength $\lambda_1$ of the primary wave mode to be excited.

The thickness h of the piezoelectric layer is essentially equal to a half-wavelength $\lambda_2/2$ or a whole wavelength $\lambda_2$ of the secondary wave mode to be excited.

In all embodiments, the distance L can be a fraction or an integer multiple of $\lambda_1$ (or $\lambda_2$). The thickness of the piezoelectric layer can be a fraction or an integer multiple of $\lambda_2/2$ (or $\lambda_1/2$) (the indices 1 and 2 stand for the primary or secondary mode to be excited).

The excited acoustic waves propagate in the longitudinal direction. The acoustic coupling takes place in the vertical direction z. The thick arrows show the direction of the acoustic coupling in all embodiments.

Figure 3A:
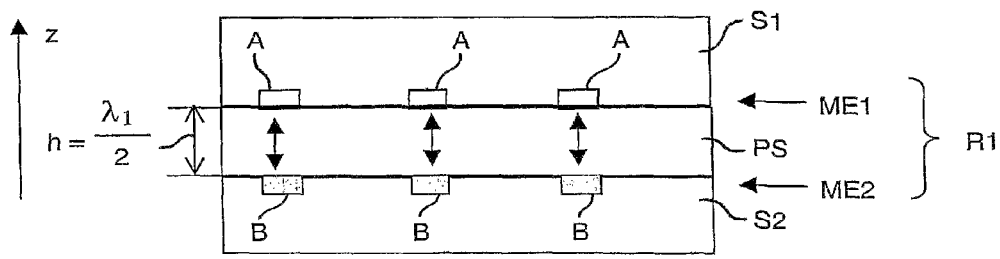
FIG. 3A, in cross section, the layer structure of a component operating with GBAW, with vertical electrical excitation of the guided bulk acoustic wave.

FIG. 3A shows a component with a resonator R1 in which the electrical excitation in the vertical direction z, indicated by arrows, takes place between two electrode structures A and B that are connected to different potentials and are located in and arranged one above the other in different metal layers ME1, ME2.

The thickness h of the piezoelectric layer may be a half-wavelength $\lambda_1/2$ or $(2n+1)(\lambda_1/2)$ of the primary wave mode to be excited, where n=0, 1, 2, ....

Figure 3B:
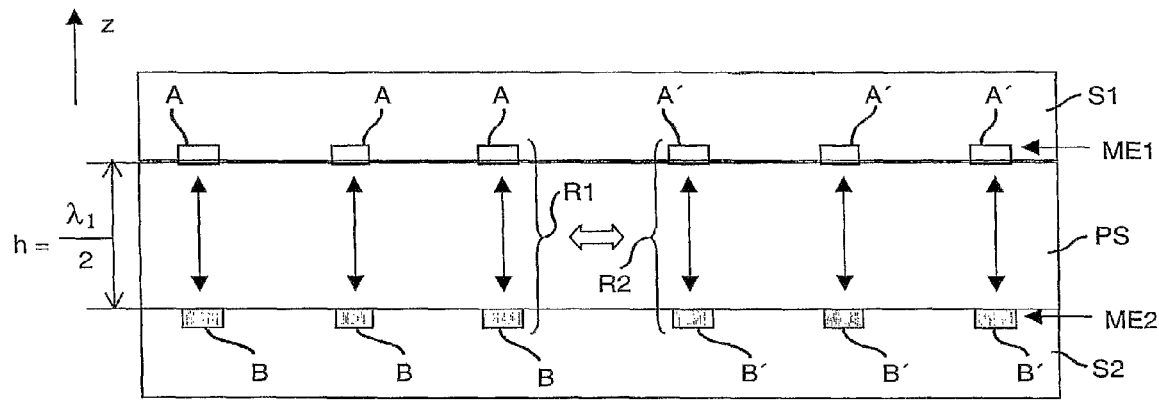
FIG. 3B, in cross section, the layer structure of a component operating with GBAW, with vertical excitation and acoustic coupling in the longitudinal direction.

A component with resonators R1 and R2 arranged side by side in the longitudinal direction, according to FIG. 3A is shown in schematic cross section in FIG. 3B.

Second resonator R2 has electrode structures arranged one above the other of electrodes A' and B', between which a vertical excitation takes place. First electrodes A and A', respectively, of the first and the second resonator are formed in the same metal layer ME1. Second electrodes B and B', respectively, of the first and the second resonator are formed in the same metal layer ME2. Each electrode A, A', B, B' has respective periodically arranged metal strips (or electrode structures). It is also possible for one of the electrodes of the first or second resonator to be formed as a continuous metal surface as in FIG. 3C. If one electrode of the first and second resonator is embodied as a metal surface, then these metal surfaces can be located in different metal planes. For instance, the left resonator can have continuous metal surface in metal layer ME1 and the right resonator can have the continuous metal surface in metal layer ME2.

The longitudinal acoustic coupling between resonators R1, R2 is illustrated with a thick arrow.

Figure 3C:
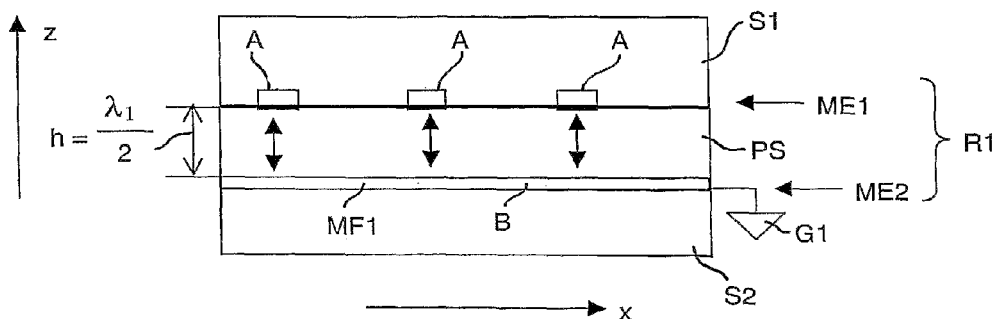
FIG. 3C, a variant of the resonator according to FIG. 3A, in which the counterelectrode is formed as a continuous ground surface.

FIG. 3C shows a variant of the resonator shown in FIG. 3A in which second electrode B is formed as a conductive surface MF1 (which may be electrically connected to a reference potential G1 in case of an asymmetric connection of the resonator).

Figure 4A:
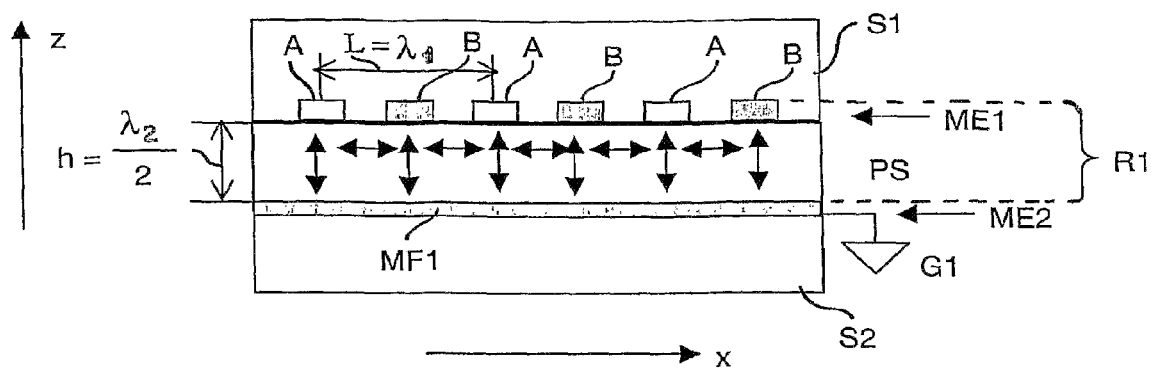
FIG. 4A, in cross section, the layer structure of a resonator operating with GBAW, with a primary excitation of GBAW in the longitudinal direction and a secondary excitation of GBAW in the vertical direction.

FIG. 4A shows a resonator R1 with primary electrical excitation in the longitudinal direction, as in FIG. 2A.

A conductive surface MF1 is arranged in metal layer ME2 underneath the transducer with comb-like electrodes A, B.

The secondary wave mode to be excited is excited between the electrode structures of first electrode A and conductive surface MF1, on the one hand, and between the electrode structures of second electrode B and metal surface MF1 on the other. The primary and secondary excitation is respectively indicated by horizontal and vertical arrows.

The distance L between the centers of the equally charged electrode strips here is essentially one wavelength $\lambda_1$ of the primarily excited wave mode. Thickness h of the piezoelectric layer may be a half-wavelength $\lambda_2/2$ of the secondarily excited wave mode.

Figure 4B:
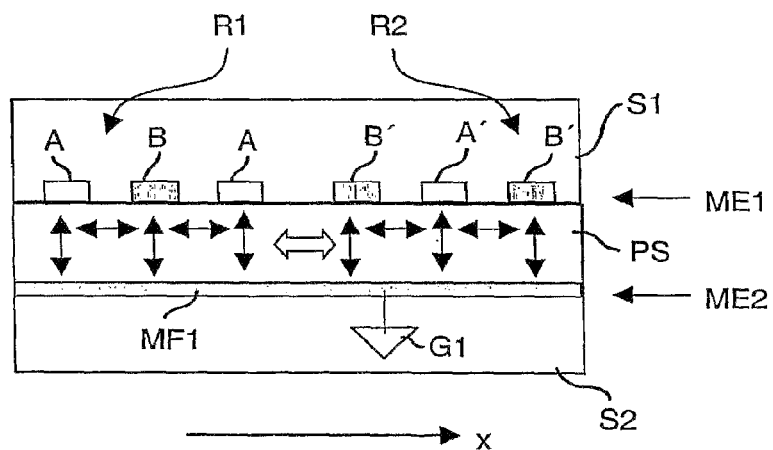
FIG. 4B, two resonators according to FIG. 4A that are acoustically coupled in the longitudinal direction via the combination of the piezoelectric layer and a conductive surface.

A component with coupled resonators R1 and R2 according to FIG. 4A arranged one alongside the other in the longitudinal direction is shown in schematic cross section in FIG. 4B. Second resonator R2 comprises a transducer W2 with electrodes A' and B'.

Figure 4C:
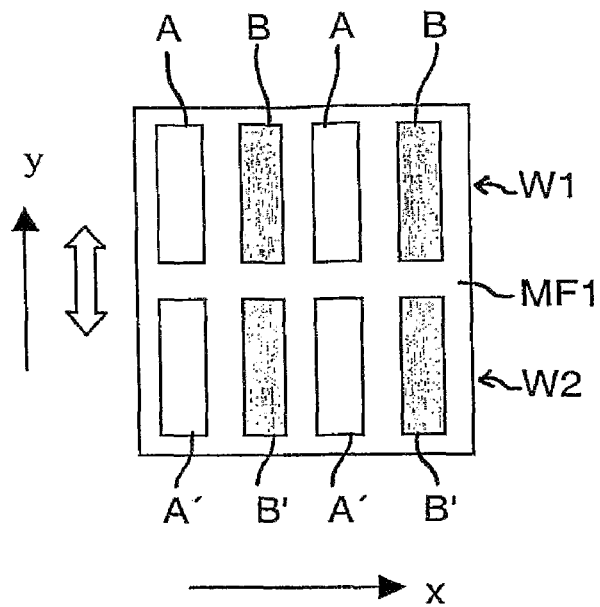
FIG. 4C, the plan view onto resonator arrangement of two resonators according to FIG. 4A that are acoustically coupled in the transversal direction via the combination of the piezoelectric layer and a conductive surface.
Figure 4D:
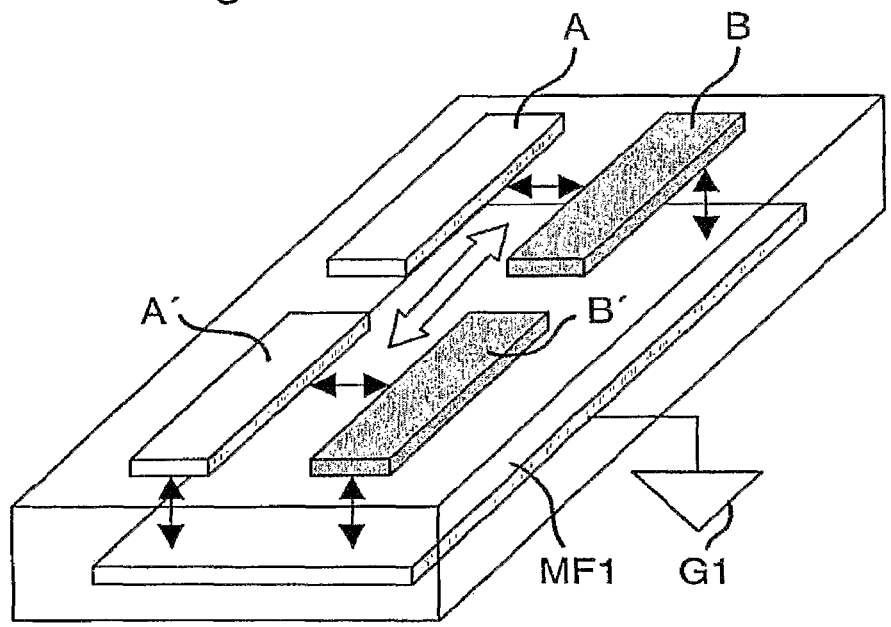
FIG. 4D, the perspective plan view onto the resonator arrangement according to FIG. 4B.

It is also possible to excite a wave in the longitudinal and/or vertical direction that propagates in the transversal direction and can be utilized for transversal acoustic coupling of two resonators. The component with resonators R1, R2 arranged one alongside the other in the transversal direction and acoustically coupled to one another in that direction is shown in FIG. 4C in a schematic plan view. The resonator arrangement according to FIG. 4C is shown in perspective plan view in FIG. 4D.

The two resonators R1, R2 in FIGS. 4B, 4C are arranged above the same continuous conductive surface MF1. The electrodes of the resonators are electrically isolated from one another. Resonators R1, R2 are acoustically coupled to one another via a coupling system that comprises the piezoelectric layer and conductive surface MF1.

Figure 5A:
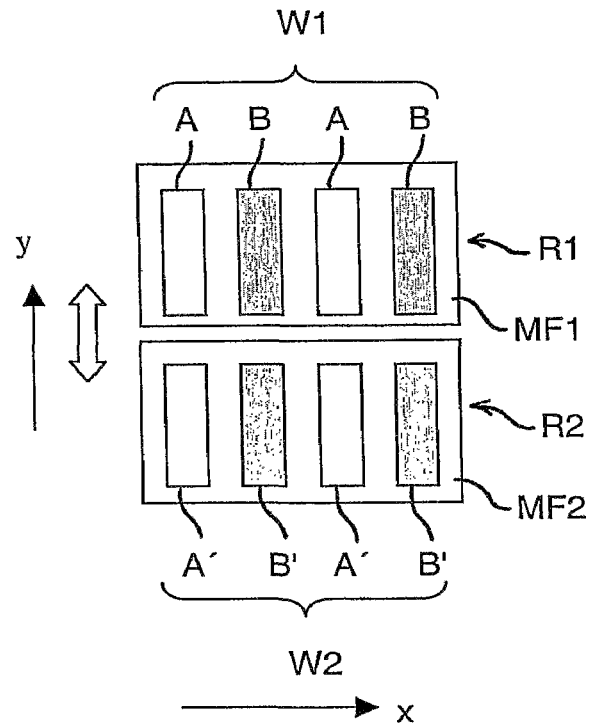
FIG. 5A, the plan view onto a component with resonators according to FIG. 4A acoustically coupled in the transversal direction via the piezoelectric layer.

FIG. 5A shows a variant of the arrangement shown in FIG. 4C in which each transducer W1, W2 is arranged above a conductive surface MF1, MF2 of its own, these surfaces being electrically isolated from one another and may be electrically connected to different reference potentials. The acoustic coupling between the resonators here takes place in the transversal direction y only via piezoelectric layer PS1.

Figure 5B:
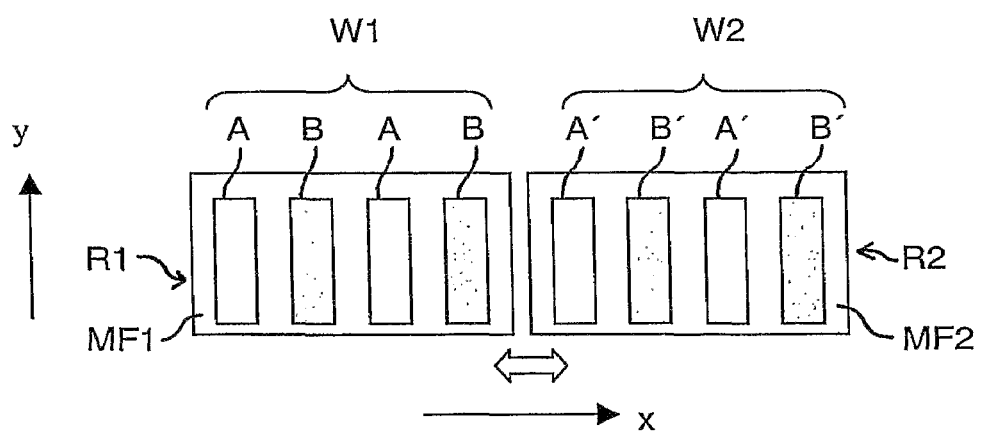
FIG. 5B, two resonators according to FIG. 4A that are acoustically coupled to one another in the longitudinal direction via the piezoelectric layer.

A variant of the arrangement shown in FIG. 4B in which each transducer W1, W2 is arranged above a separate conductive surface MF1, MF2 is shown in FIG. 5B. The acoustic coupling between the resonators here takes place in the longitudinal direction y only via piezoelectric layer PS1.

Figure 6:
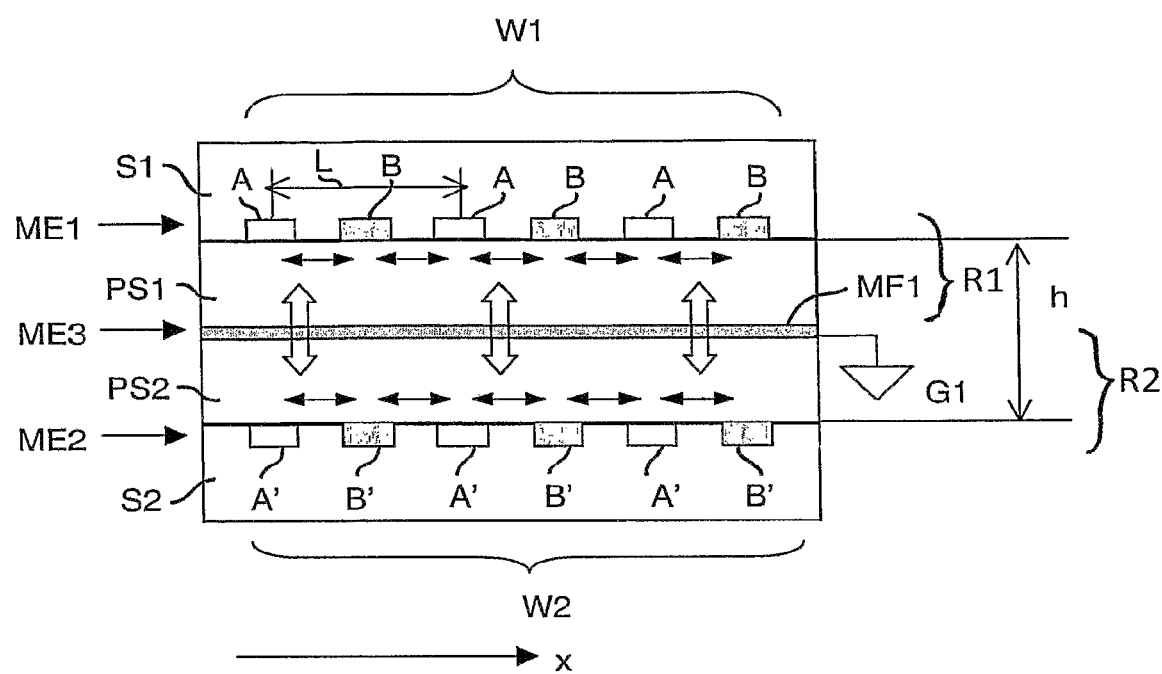
FIG. 6, a variant of the component shown in FIG. 2A, in which the piezoelectric layer comprises two sub-layers separated by a central metal layer.

FIG. 6 shows a component that comprises two lateral excitation planes ME1, ME2. First transducer W1 with the electrode structures of electrodes A and B is formed in first metal layer ME1, and second transducer W2 with the electrode structures of electrodes A' and B' is formed in second metal layer ME2. The lateral electrical excitation here takes place in the longitudinal direction x between two electrode structures of the same transducer connected to different potentials that are situated in a metal layer ME1 or ME2, i.e., between electrodes A and B of the first transducer and electrodes A' and B' of the second transducer, respectively. The difference relative to FIG. 2A is that, instead of only one piezoelectric layer, the layer system comprises two piezoelectric layers PS1, PS2 separated by a third metal layer ME3. A continuous electrically conductive surface MF1, is formed in (central) third metal layer ME3.

Conductive surface MF1 is connected to a reference potential G1 and constitutes a reference potential surface. A secondary wave in the vertical direction is also excited here, between the electrode structure of the first or the second transducer and conductive surface MF1. In another embodiment, conductive surface MF1 can also be floating. In another embodiment, it is possible for conductive surface MF1 to be replaced by a finger structure or a grating.

The GBAW excited in the first transducer is guided in first piezoelectric layer PS1, and the GBAW excited in the second transducer is guided in second piezoelectric layer PS2 in the lateral (here transversal) direction. Resonators R1, R2 in FIG. 6 are vertically coupled to one another by a coupling system that comprises the two piezoelectric layers PS1, PS2 and reference potential surface MF1.

Figure 7:
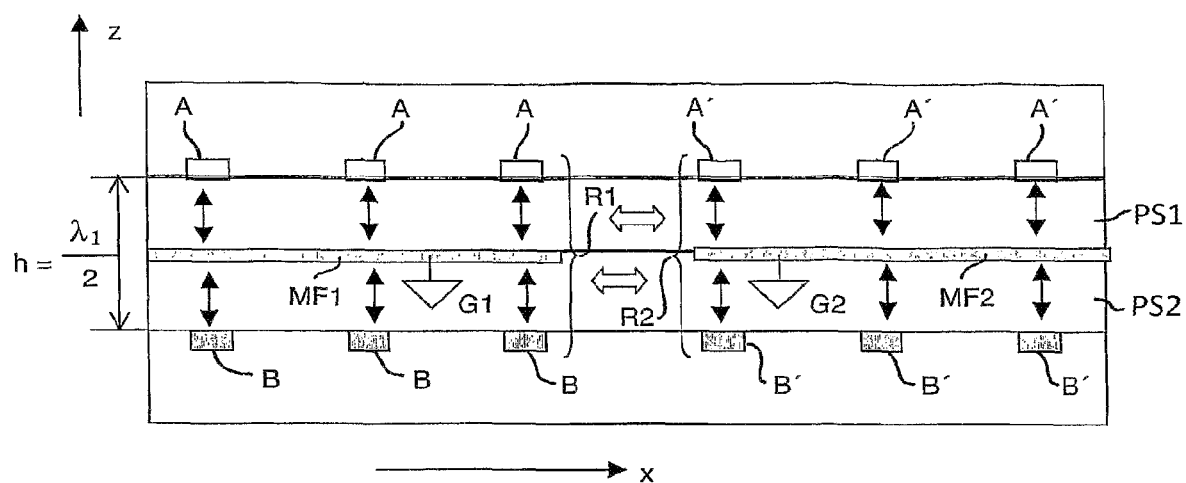
FIG. 7, a variant of the component shown in FIG. 3B, in which the piezoelectric layer comprises two sub-layers separated by a central metal layer.

A variant of the component shown in FIG. 3B is shown in FIG. 7. Unlike FIG. 3B, the piezoelectric layer here comprises two sub-layers PS1 and PS2 separated from one another by a central metal layer. A first metal surface MF1 that is arranged between first and second electrodes A, B of first resonator R1 is formed in the central metal layer. In addition, a second metal surface MF2 that is arranged between first and second electrodes A', B' of second resonator R2 is formed in the central metal layer. Metal surfaces MF1, MF2 may be electrically isolated from one another, and in one embodiment, are each electrically connected to a potential G1, G2, respectively, of their own. In a further embodiment, metal surfaces MF1, MF2 can be electrically connected.

The vertical excitation takes place in first resonator R1 between the respective electrode (A or B) and metal surface MF1. The vertical excitation takes place in second resonator R2 between the respective electrode (A' or B') and metal surface MF2. The waves excited in the respective piezoelectric layer PS1, PS2 in the two resonators couple with one another via this layer.

Figure 8A:
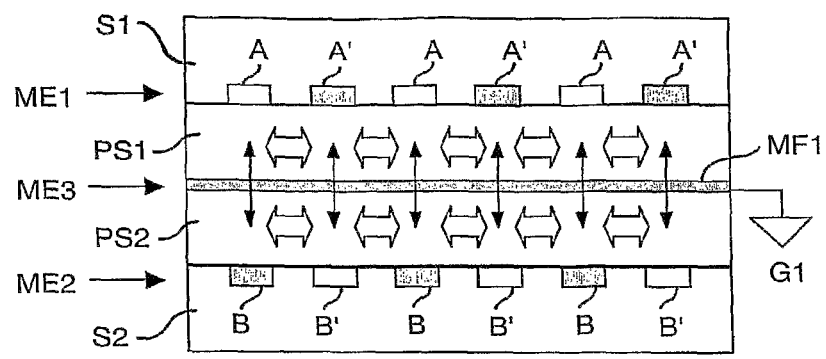
FIG. 8A, a component with a primary excitation in the vertical direction and interpenetrating electrodes of different resonators.
Figure 8B:
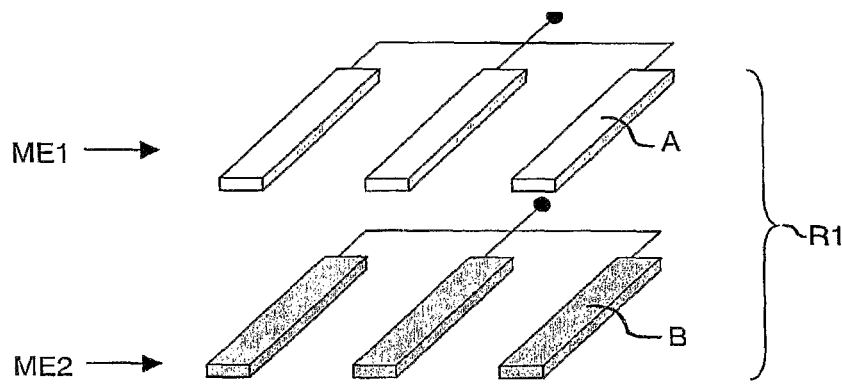
FIG. 8B, a perspective plan view onto the first resonator according to FIG. 8A.
Figure 8C:
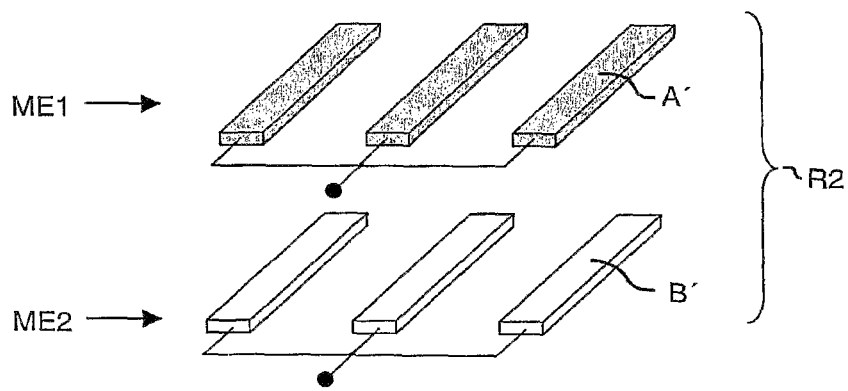
FIG. 8C, a perspective plan view onto the second resonator according to FIG. 8A.

FIG. 8A shows a component with two resonators R1 and R2, wherein electrodes A, B (or A', B' respectively) of each resonator lie opposite one another, or are situated in different planes ME1, ME2. FIG. 8B shows first resonator R1, which comprises a first (hot) electrode A and a second (cold) electrode B. FIG. 8C shows second resonator R2, which comprises a first (e.g., cold) electrode A' and a second (hot) electrode B'. Electrode structures A, A' are formed in metal layer ME1 and arranged alternatingly. Electrode structures B, B' are formed in metal layer ME2 and arranged alternatingly.

Conductive surface MF1 formed in third metal layer ME3 may be at ground potential in this embodiment.

The primary excitation takes place in the vertical direction between the electrode structures of first and second resonator, respectively, and the conductive surface. A secondary acoustic mode is excited in the lateral direction between two electrode structures A and A' of the first and second resonators, respectively, that are situated in the same metal layer ME1 and are connected to different electric potentials. An additional secondary mode is excited in the longitudinal direction between two electrode structures B and B' of the first and second resonators, respectively, that are situated in the same metal layer ME2 and are connected to different electric potentials.

It is possible to forgo the separation of the piezoelectric layer into two sub-layers by third metal layer ME3 shown in FIG. 8A. The vertical excitation takes place between first electrode A and the opposing second electrode B of the first resonator. The vertical excitation also takes place between first electrode A' and the opposing second electrode B' of the second resonator.

The wave modes excited in the vertical direction as well as those excited in the longitudinal direction propagate in the lateral direction. It is possible for the longitudinally and the vertically excited waves to propagate in the same direction x (e.g., longitudinally). It is also possible for the propagation directions of the vertically and longitudinally excited wave modes to differ by, for instance, 90°, the longitudinally excited wave mode running in the longitudinal direction and the vertically excited wave mode running in the transversal direction y. It is also possible, however, for the vertically excited wave mode to propagate in the longitudinal direction and the longitudinally excited one to propagate in the transversal direction.

Resonators R1, R2 shown in FIG. 8A are acoustically coupled to one another in the longitudinal direction.

Process steps in the manufacturing of a component operating with GBAW with two excitation directions are shown in FIGS. 9A-9E.

Figure 9A:
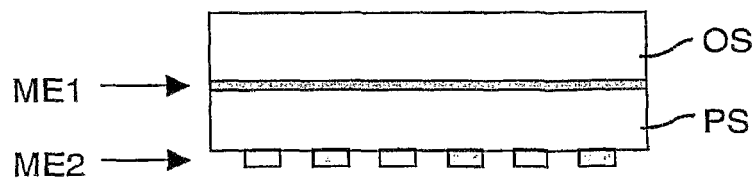
FIGS. 9A-9E, process steps in the construction of a GBAW waveguide with only one piezoelectric layer.

First a layer structure shown in FIG. 9A is prepared, wherein a first metal layer ME1, a piezoelectric layer PS and a structured second metal layer ME2 are arranged on a sacrificial substrate OS. The layer structure shown in FIG. 9A is rotated 180°, with sacrificial substrate OS facing upwards.

In one embodiment, electrode structures are formed in an initially continuous second metal layer ME2 by, for instance, etching. It is also possible to produce the structured metal layer using masks.

Figure 9B:
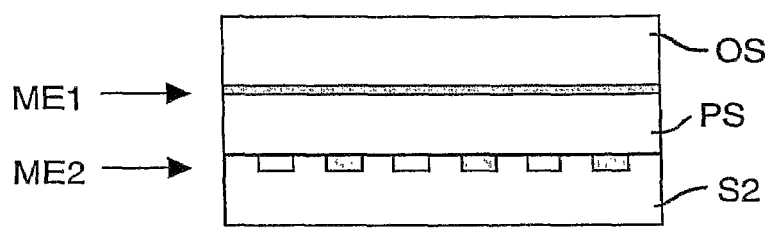
Figure 9C:
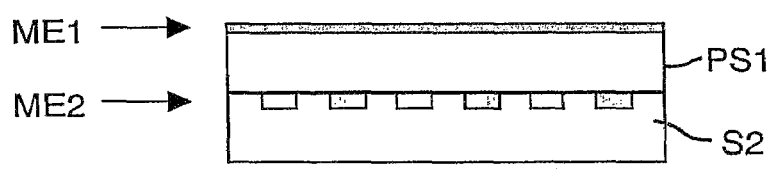

In the process step shown in FIG. 9B, the above-described layer structure is tightly joined to a second substrate S2. Thereafter, sacrificial substrate OS is removed (FIG. 9C).

Figure 9D:
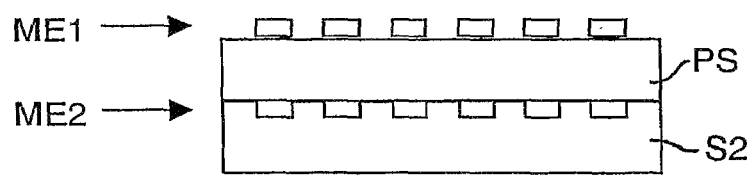
Figure 9E:
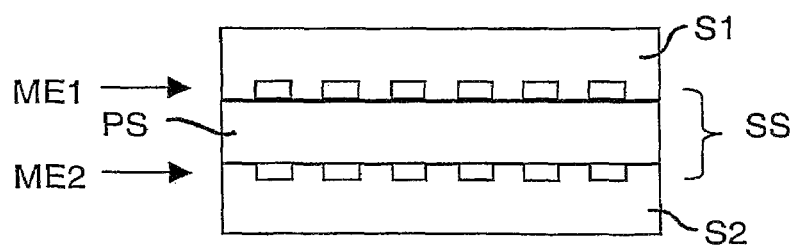

Metal layer ME1 is structured to form electrode structures and contact surfaces (FIG. 9D). A substrate S1 is applied to structured metal layer ME1 (FIG. 9E). The waveguiding layer system SS in this embodiment comprises the successive layers ME2, PS and ME1.

An additional process is shown in FIGS. 10A-10E. The steps shown in FIGS. 10A-10C correspond to FIGS. 9A-9C, wherein, respectively, first metal layer ME1 is to be replaced by a third metal layer ME3 and piezoelectric layer PS by a first piezoelectric layer PS1.

Figure 10A:
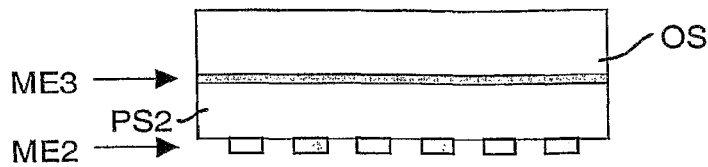
FIGS. 10A-10E, process steps in the construction of GBAW waveguide with two piezoelectric layers and a metal layer arranged between them.
Figure 10B:
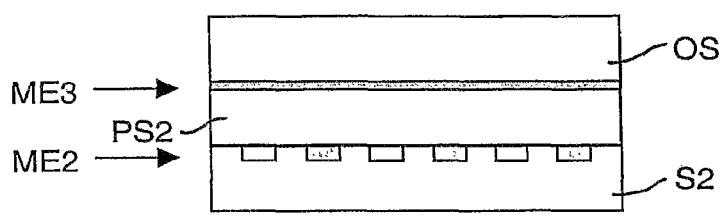
Figure 10C:
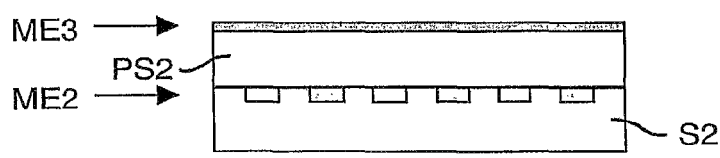
Figure 10D:
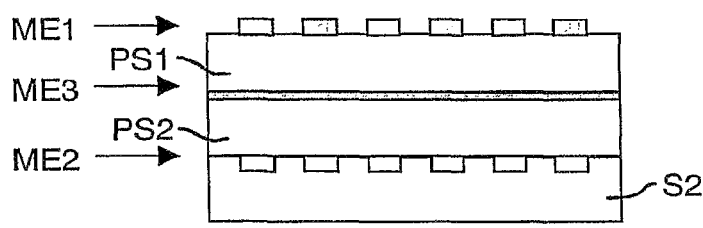
Figure 10E:
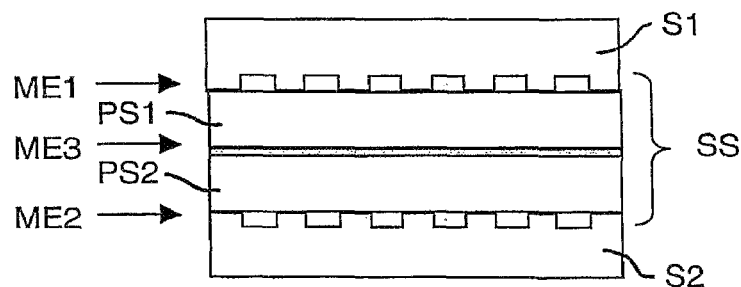
Figure 11A:
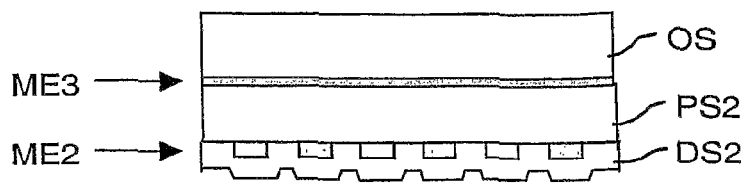
FIGS. 11A-11E, process steps in the construction of a GBAW waveguide with planarization layers.
Figure 11B:
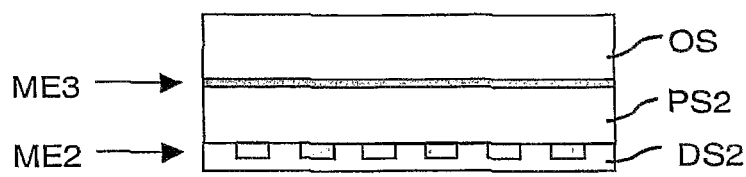
Figure 11C:
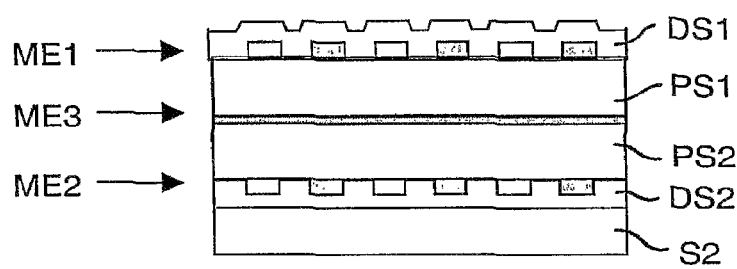
Figure 11D:
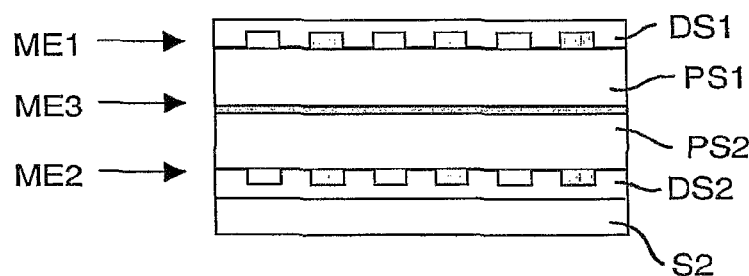
Figure 11E:
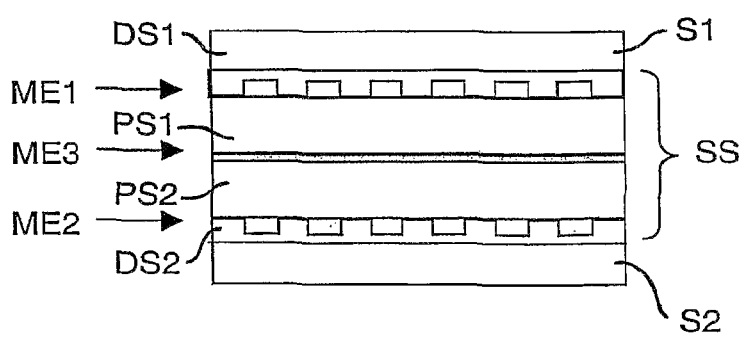

A first piezoelectric layer PS1, on which a structured first metal layer ME1 is produced, is applied to the exposed surface of third metal layer ME3 (FIG. 10D). A first substrate S1 is applied to metal layer ME1 (FIG. 10E). The waveguiding layer system SS in this variant comprises the successive layers ME2, PS2, ME3, PS1 and ME1.

A variation of the process presented in FIGS. 10A-10E is shown in FIGS. 11A-11E.

Between first substrate S1 and first metal layer ME1, as well as between second substrate S2 and second metal layer ME2, a planarized dielectric layer DS1 and DS2, respectively, having a planar surface facing first and second substrate S1, S2, is applied.

The waveguiding layer system SS in this embodiment comprises the successive layers DS2, ME2, PS2, ME3, PS1, ME1 and DS1.

The process according to FIGS. 10A-10E has the advantage that a layer system with different orientations of the piezoelectric axis in piezoelectric sub-layers can be produced with it.

Although it was possible to describe only a limited number of possible embodiments, the claims are not limited to these embodiments. It is possible to produce electroacoustically active structures such as transducers and reflectors in an arbitrary number and shaping in order to vary the properties of the component in a desired manner. Nor are the claims limited to the above-specified materials or to certain frequency ranges. The characteristics mentioned in connection with an embodiment are not limited to the embodiments mentioned and can be combined with other embodiments. All metal layers can comprise externally contactable contact surfaces in addition to electrode structures. The electrode structures present in various metal layers can have heights and compositions differing from one another. All layers can comprise several successive sub-layers. In particular, a metal layer can represent a series of layers of, for example, Al and Cu.

What is claimed is:

1. An acoustic wave component comprising:
    a layer system comprising a piezoelectric layer and a first metal layer on the piezoelectric layer;
    a first resonator comprising a first electrode in the first metal layer, the first metal layer comprising electrode structures periodically arranged in a direction of propagation of a wave through the acoustic wave component; and
    a second resonator coupled to the first resonator and electrically isolated from the first resonator;
    wherein the layer system comprises a waveguide for guiding a guided bulk acoustic wave in a lateral direction of the acoustic wave component;
    wherein the first and second resonators are coupled via a coupling system that comprises the layer system; and
    wherein the first and second resonators are acoustically coupled to one another in a transverse direction via the coupling system.

2. The acoustic wave component of claim 1, further comprising:
    a second metal layer below the piezoelectric layer;
    the second metal layer having a conductive surface that is below a first transducer of the first resonator and that serves as second electrode of the first resonator.

3. The acoustic wave component of claim 1, wherein the coupling system comprises two piezoelectric sub-layers separated by a third metal layer.

4. The acoustic wave component of claim 3, wherein first and second transducers are parts of the first and second resonators, respectively, and wherein a first conductive surface is between the first and second transducers and is in the second metal layer.

5. An acoustic wave component comprising:
    a layer system comprising a piezoelectric layer and a first metal layer on the piezoelectric layer;
    a first resonator comprising a first electrode in the first metal layer, the first metal layer comprising electrode structures periodically arranged in a direction of propagation of a wave through the acoustic wave component, the first resonator comprising a second electrode in the first metal layer, electrode structures of the first electrode and the second electrode alternating and forming a first transducer;
    a second resonator coupled to the first resonator and electrically isolated from the first resonator;
    a first signal path that is between first terminals of a first electrical port and a second electrical port; and
    a second signal path that is arranged between second terminals of the first electrical port and the second electrical port;
    wherein the first transducer is in the first signal path and a second transducer is in the second signal path; and
    wherein the layer system comprises a waveguide for guiding a guided bulk acoustic wave in a lateral direction of the acoustic wave component.

6. A method for manufacturing a component that operates with guided acoustic waves, comprising:
    forming, on a first substrate, a layer structure comprised of a continuous metal layer, a piezoelectric layer, and a structured metal layer;
    joining the layer structure to a second substrate;
    removing the first substrate;
    applying, to an exposed surface of the continuous metal layer, an additional layer structure comprising an additional piezoelectric layer and an additional structured metal layer; and
    joining the additional layer structure to a third substrate.

7. The method of claim 6, wherein connection between the layer structure and the second substrate and/or connection between the additional layer structure and the third substrate is via wafer-bonding.

8. The method of claim 6, wherein at least one substrate of the first, second and third substrates comprises a thick film.

9. The method of claim 6, further comprising:
producing a planarization layer as a last layer in the layer structure before joining the layer structure to the second substrate and/or in the additional layer structure before joining the additional layer structure to the third substrate.

10. The method of claim 6, further comprising:
forming a continuous metal layer in which electrode structures are structured by etching, in order to form the structured metal layer or the additional structured metal layer.

11. The method of claim 6, wherein the structured metal layer and/or the additional structured metal layer is produced using masks.

* * * * *

UNITED STATES PATENT AND TRADEMARK OFFICE
CERTIFICATE OF CORRECTION

| | | |
|---|---|---|
| PATENT NO. | : 8,471,652 B2 | Page 1 of 1 |
| APPLICATION NO. | : 11/576981 | |
| DATED | : June 25, 2013 | |
| INVENTOR(S) | : Veit Meister | |

It is certified that error appears in the above-identified patent and that said Letters Patent is hereby corrected as shown below:

Title Page, Item (54) and in the Specification, Column 1, Lines 1-3, Title;
Delete "COMPONENT THAT OPERATES USING ACOUSTIC WAVES AND METHOD FOR PRODUCING SAID COMPONENT" and Insert -- ACOUSTIC WAVE COMPONENT AND METHOD FOR THE MANUFACTURE THEREOF --

Title Page 2, Column 2 (Other Publications), Line 4;
Delete "Intergration" and Insert -- Integration --

Title Page 2, Column 2 (Other Publications), Line 8;
Delete "Intl'l." and Insert -- Int'l. --

In the Claims

Column 12, Claim 3, Line 24 and 25;
Delete "two piezoelectric sub-layers separated by a third metal
layer." and Insert -- the piezoelectric layer and a second piezoelectric layer which are
separated by a second metal layer. --

Signed and Sealed this
Twenty-fourth Day of June, 2014

Michelle K. Lee
*Deputy Director of the United States Patent and Trademark Office*